(12) United States Patent  
Yamamoto et al.

(10) Patent No.: US 8,470,438 B2
(45) Date of Patent: Jun. 25, 2013

(54) ELECTRODE-CONNECTING STRUCTURE, CONDUCTIVE ADHESIVE USED FOR THE SAME, AND ELECTRONIC APPARATUS

(75) Inventors: Masamichi Yamamoto, Osaka (JP); Kyouichirou Nakatsugi, Osaka (JP); Yasuhiro Okuda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 28 days.

(21) Appl. No.: 13/139,926

(22) PCT Filed: Jun. 4, 2010

(86) PCT No.: PCT/JP2010/059500
§ 371 (c)(1),
(2), (4) Date: Jun. 15, 2011

(87) PCT Pub. No.: WO2010/147002
PCT Pub. Date: Dec. 23, 2010

(65) Prior Publication Data
US 2011/0250395 A1    Oct. 13, 2011

(30) Foreign Application Priority Data
Jun. 15, 2009    (JP) .................................. 2009-142283

(51) Int. Cl.
*B32B 5/16* (2006.01)

(52) U.S. Cl.
USPC ........................................................ 428/323

(58) Field of Classification Search
USPC ........................................................ 428/323
See application file for complete search history.

(56) References Cited

U.S. PATENT DOCUMENTS

| 5,600,103 A * | 2/1997 | Odaira et al. ............... 174/265 |
| 2005/0173678 A1* | 8/2005 | Miura et al. ............... 252/394 |
| 2006/0023154 A1* | 2/2006 | Harada et al. ............... 349/149 |

FOREIGN PATENT DOCUMENTS

| JP | 04-051592 A | 2/1992 |
| JP | 04-159794 A | 6/1992 |
| JP | 04-162693 A | 6/1992 |
| JP | 06-051337 | 2/1994 |
| JP | 06-052715 A | 2/1994 |

(Continued)

OTHER PUBLICATIONS

Examiner's Decision of Refusal, with partial English translation, issued in Japanese Patent Application No. 2009-142258, dated Jun. 1, 2011.

(Continued)

*Primary Examiner* — Elizabeth A Robinson
(74) *Attorney, Agent, or Firm* — McDermott Will & Emery LLP

(57) ABSTRACT

There is provided a connecting structure with high reliability produced at low cost through the production process simplified by connecting connection electrodes, each including an organic film as an oxidation preventing film, to each other using a conductive adhesive. An electrode-connecting structure in which a first connection electrode 2 and a second connection electrode 10 are connected to each other with a conductive adhesive layer 9 therebetween includes organic films 6 and 11 formed on at least the first connection electrode and conductive particles 8 contained so that major axes of the particles are oriented in a thickness direction of the conductive adhesive layer and the average length of the major axes is larger than the total thickness of at least the organic films and the conductive adhesive layer, wherein the conductive particles pierce the organic films and contact the first connection electrode and the second connection electrode.

10 Claims, 5 Drawing Sheets

FOREIGN PATENT DOCUMENTS

| | | | |
|---|---|---|---|
| JP | 07-029419 A | 1/1995 |
| JP | 08-319467 | 12/1996 |
| JP | 10-079568 | 3/1998 |
| JP | 11-241054 | 9/1999 |
| JP | 2000-086981 A | 3/2000 |
| JP | 2000-129216 A | 5/2000 |
| JP | 2001-345544 | 12/2001 |
| JP | 2002-299809 A | 10/2002 |
| JP | 2003-064324 | 3/2003 |
| JP | 2005-068530 | 3/2005 |
| JP | 2006-041374 | 2/2006 |
| JP | 2007-059451 A | 3/2007 |
| JP | 2007-238751 A | 9/2007 |
| JP | 2008-004429 | 1/2008 |
| JP | 2008-078384 A | 3/2008 |
| JP | 2008-094908 A | 4/2008 |
| JP | 2008-097922 | 4/2008 |
| JP | 2008097922 A | * 4/2008 |
| JP | 2008-308519 A | 12/2008 |
| JP | 2009-038002 A | 2/2009 |
| JP | 2009-038732 A | 2/2009 |
| JP | 2009-088454 A | 4/2009 |
| WO | WO 2008/105397 A1 | 9/2008 |

OTHER PUBLICATIONS

Examiner's Decision of Dismissal of Amendment, with partial English translation, issued in Japanese Patent Application No. 2009-142258, dated Jun. 1, 2011.

Office Action, with partial English translation, issued in Japanese Patent Application No. 2009-142258, dated Mar. 10, 2011.

Office Action, with partial English translation, issued in Japanese Patent Application No. 2009-142258, dated Sep. 14, 2010.

Japanese Office Action, with partial English translation, issued in Japanese Patent Application No. 2009-142283, mailed Aug. 24, 2010.

Japanese Office Action, with partial English translation, issued in Japanese Patent Application No. 2009-142283, mailed Apr. 27, 2011.

* cited by examiner

ELECTRODE-CONNECTING STRUCTURE, CONDUCTIVE ADHESIVE USED FOR THE SAME, AND ELECTRONIC APPARATUS

RELATED APPLICATIONS

This application is the U.S. National Phase under 35 U.S.C. §371 of International Application No. PCT/JP2010/059500, filed on Jun. 4, 2010, which in turn claims the benefit of Japanese Application No. 2009-142283, filed on Jun. 15, 2009, the disclosures of which Applications are incorporated by reference herein.

TECHNICAL FIELD

The present invention relates to an electrode-connecting structure, a conductive adhesive used for the same, and an electronic apparatus.

BACKGROUND ART

In the recent trend of downsizing electronic apparatuses and demanding for high functionality of electronic apparatuses, there have been advances in a reduction in the size of connection terminals in constituent components (for example, electronic components in liquid crystal products). Thus, in the field of electronics packaging, film-like adhesives are widely used as conductive adhesives that are capable of easily establishing connections between such terminals. For example, the conductive adhesives are used to provide a connection between a printed circuit board such as a flexible printed circuit board (FPC) or a rigid printed circuit board (PWB or PCB) provided with connection electrodes composed of copper electrodes and a circuit board such as a glass board provided with connection electrodes composed of copper electrodes, or to provide a connection between a printed circuit board and an electronic component such as an IC chip.

The conductive adhesives are adhesives having anisotropic conductivity and obtained by orienting and dispersing conductive particles in an insulating resin composition. Each of the conductive adhesives is sandwiched between members to be connected with each other, and heated and pressurized. Through the application of heat and pressure, a resin in the adhesive is fluidized to seal the surfaces of electrodes. At the same time, part of the conductive particles becomes stuck between the electrodes facing each other, and the electrodes are bonded to each other while the electrical connection is established. Conventionally, the surface of a connection electrode formed on a printed circuit board or the like is plated with gold in order to prevent oxidation and ensure conductivity.

Citation List

Patent Literature
PTL 1: Japanese Unexamined Patent Application Publication No. 10-79568

SUMMARY OF INVENTION

Technical Problem

In the above-described conventional method, a nickel plating layer is formed on the surface of the connection electrode composed of copper or the like, and the gold plating layer is formed thereon. This poses problems in that the production process of electrodes becomes complicated and the production costs of a circuit board including such electrodes and an electronic apparatus including the circuit board are increased.

In the case where the gold plating is not performed on the connection electrode, a wiring base material composed of copper or the like and constituting the electrode is exposed and thus easily oxidized, which is an obstacle to electrode connection. Thus, instead of the gold plating, an organic film for preventing oxidation is often formed. The organic film is formed by performing water soluble preflux treatment (organic solderability preservation (OSP) treatment) on the surface of the connection electrode. The water soluble preflux is an acid aqueous solution containing an azole compound, and an organic film is formed while a complex is formed between the organic film and the surface of the electrode.

In an electronic component connecting step of connecting electronic components to electronic component connection electrodes of a circuit board, solder reflow process is often employed. Solder reflow process is performed by applying lead-free solder to the surfaces of electronic component connection electrodes of a circuit board, placing the electronic components thereon, and inserting the circuit board in a reflow furnace. Connection electrodes of a flexible printed circuit board for wiring or the like are connected to connection electrodes of the circuit board to which the electronic components have been connected, using the above-described conductive adhesive. The conductive particles in the conductive adhesive pierce the organic film formed on each of the surfaces of the connection electrodes to establish electrical connection.

However, in the solder reflow process, the organic film is often hardened by the action of heat. Thus, the conductive particles in the conductive adhesive cannot pierce the organic film, which may cause poor connection. In the case where the organic film is not formed, the surfaces of connection electrodes are oxidized, which causes poor connection or the like.

To solve the above-described problem, an object of the present invention is to provide an electrode-connecting structure with high reliability produced at low cost through the production process simplified by connecting connection electrodes, each including an organic film as an oxidation preventing film, to each other using a conductive adhesive, a conductive adhesive used for the electrode-connecting structure, and an electronic apparatus.

Solution to Problem

The present invention according to a first aspect of invention of the present application provides an electrode-connecting structure in which a first connection electrode and a second connection electrode are connected to each other with a conductive adhesive layer therebetween, the electrode-connecting structure including an organic film formed on at least the first connection electrode and conductive particles contained so that major axes of the particles are oriented in a thickness direction of the conductive adhesive layer and the average length of the major axes is larger than the total thickness of at least the organic film and the conductive adhesive layer, wherein the conductive particles pierce the organic film and contact the first connection electrode and the second connection electrode.

The present invention is applied to an electrode on which an organic film for preventing oxidation is formed. The organic film does not have conductivity. Thus, conductive particles that pierce the organic film to establish electrical connection need to be contained in the conductive adhesive.

The conductive particles according to the present invention are contained so that major axes of the particles are oriented in a thickness direction of the conductive adhesive layer and the average length of the major axes is larger than the total thickness of at least the organic film and the conductive adhesive layer.

By orienting the conductive particles in the thickness direction of the conductive adhesive layer, the insulation between the adjacent connection electrodes is maintained to prevent a short circuit between the electrodes. Moreover, many electrodes facing each other can be independently electrically connected to each other at the same time.

By setting the average length of the major axes of the conductive particles as described above, when the conductive adhesive is pressurized between the electrodes, the conductive particles can be caused to pierce the organic film so that the edge portions of the conductive particles can reach the connection electrodes.

By employing the conductive particles, the connection electrodes can be electrically connected to each other using the conductive particles that act as a bridge between the connection electrodes facing each other. Therefore, the electrodes connected to each other with the conductive adhesive therebetween can be electrically connected to each other with certainty, which increases the reliability of the connecting structure between electrodes.

In the case where electronic components are mounted on the circuit board provided with the connection electrode, the organic film is formed and then the electronic components are connected to the circuit board through solder reflow process. Therefore, the organic film is often hardened.

In the present invention, even if a hardened organic film is present, the conductive particles can pierce the organic film. Thus, the connection electrodes can be connected to each other with certainty. In addition, since the oxidation of the connection electrodes can be prevented due to the organic film, the production cost of electronic apparatuses or the like can be significantly reduced compared with the conventional case where gold plating is formed. Furthermore, by performing the solder reflow process in a non-oxidizing atmosphere, the oxidation of the electrodes in that process is prevented and thus the connection electrodes can be connected to each other with certainty.

Connection electrodes to which the connection method according to the present invention is applied and a circuit board having such electrodes formed thereon are not particularly limited as long as an organic film for preventing oxidation is included. For example, the electrode-connecting structure according to the present invention can be applied to not only the case of an electrode formed on a printed circuit board or the like, but also the case where an electrode of an electronic component and an electrode of a circuit board are connected to each other.

The present invention can be applied to not only an electrode whose organic film is hardened through solder reflow process, but also a circuit board that is not subjected to solder reflow process and the connection of a connection electrode of an electronic component. Since the conductive particles can pierce an organic film having a thickness larger than that in the related art, the thickness of the organic film formed on the electrode can be increased, thereby improving oxidation resistance.

The type of an organic film to which the electrode-connecting method according to the present invention can be applied is not particularly limited. The water soluble preflux treatment is performed, for example, through the action of an acid aqueous solution containing an azole compound. Examples of the azole compound include imidazole, 2-undecylimidazole, 2-phenylimidazole, 2,2,4-diphenylimidazole, triazole, aminotriazole, pyrazole, benzothiazole, 2-mercaptobenzothiazole, benzimidazole, 2-butyl benzimidazole, 2-phenylethyl benzimidazole, 2-naphthyl benzimidazole, 5-nitro-2-nonyl benzimidazole, 5-chloro-2-nonyl benzimidazole, 2-amino benzimidazole, benzotriazole, hydroxybenzotriazole, and carboxyl benzotriazole.

Furthermore, an organic film containing at least one organic compound selected from 2-phenylimidazole groups such as 2-phenyl-4-methyl-5-benzylimidazole, 2,4-diphenylimidazole, and 2,4-diphenyl-5-methylimidazole and benzimidazole groups such as 5-methyl benzimidazole, 2-alkyl benzimidazole, 2-aryl benzimidazole, and 2-phenyl benzimidazole has a satisfactory oxidation preventing function because of its high thermal resistance and thus is preferably used.

The average thickness of the organic film is preferably 0.05 μm or more and 0.5 μm or less. If the average thickness of the organic film is less than 0.05 μm, the oxidation preventing function of the organic film is not easily ensured and thus the surface of the connection electrode may be oxidized. On the other hand, if the average thickness of the organic film is more than 0.5 μm, the electrical connection using conductive particles sometimes cannot be established.

As in the invention according to a second aspect of invention of the present application, in a section that is perpendicular to the thickness direction of the conductive adhesive layer, conductive particles having a minor axis of 0.01 to 1 μm are preferably contained so that the number of the conductive particles is 30,000 to 300,000/mm$^2$.

If the minor axis of the conductive particles is 0.01 μm or less, the strength required when the conductive particles pierce the organic film cannot be ensured. If the minor axis of the conductive particles is more than 1 μm, the insulating property between the adjacent conductive particles may be degraded.

If the number of the conductive particles is less than 30,000/mm$^2$, the number of conductive particles that can be brought into contact with the electrode is decreased. On the other hand, if the number of the conductive particles is more than 300,000/mm$^2$, the adjacent conductive particles may contact each other and thus the insulating property is degraded.

By specifying the blending amount of the conductive particles as described above, when the conductive adhesive is pressurized between the electrodes, a force that pierces the organic film can be imparted to the conductive particles. Furthermore, since the sufficient number of conductive particles can be brought into contact with the connection electrode, the electrical resistance is reduced and thus a secure electrode-connecting structure can be obtained.

The configuration of the conductive particles is also not particularly limited. For example, as in the invention according to a third aspect of invention of the present application, the conductive particles are preferably metal powder having a needle shape or a shape in which many fine metal particles are linearly joined together.

By employing such a form of the conductive particles, in the joint surface direction of the conductive adhesive layer, the insulation between the adjacent electrodes is maintained to prevent a short circuit. In the thickness direction, electrical connection can be ensured through a large number of the conductive particles. Accordingly, the reliability of the electrical connection between the connection electrodes is improved.

As in the invention according to a fourth aspect of invention of the present application, the conductive particles preferably have an aspect ratio of five or more. The aspect ratio mentioned herein is the ratio of the average length of major axes (the length of the conductive particles) to the average length of minor axes (the length of a section of the conductive particles) of the conductive particles.

By employing conductive particles having an aspect ratio of five or more, even if the number of conductive particles is increased, the degradation of the insulating property between the adjacent electrodes due to an increase in volume density is not caused. The contact probability with the electrodes is also increased.

The configuration of the conductive adhesive is also not particularly limited. For example, the adhesive layer can be formed by employing a fluid conductive adhesive, applying the conductive adhesive to the connection electrode, and orienting the major axes of the conductive particles in the thickness direction.

As in the invention according to a fifth aspect of invention of the present application, the conductive adhesive layer may be formed of a film-like adhesive. By employing the film-like conductive adhesive, the handling becomes easy. Moreover, the work efficiency in connecting electrodes is improved by performing heat and pressure treatment using the adhesive.

The invention according to a sixth aspect of invention of the present application provides a film-like conductive adhesive used for an electrode-connecting structure in which an organic film is formed on at least one of electrodes connected, the conductive adhesive including an adhesive component containing a thermosetting resin and conductive particles having major axes oriented in a thickness direction of a film, wherein the average length of the major axes of the conductive particles is set to be larger than the total thickness of the organic film and an adhesive layer formed after electrode connection.

The conductive particles employed in the electrode-connecting structures according to the first though fifth aspects of invention of the present application can be used as the above-described conductive particles. In this configuration, the electrodes are connected to each other by causing the conductive particles to act as a bridge between the electrodes. Accordingly, an electrode-connecting structure with high reliability can be obtained.

The adhesive is mainly composed of a thermosetting resin, and a curing agent and various fillers can be added thereto. Examples of the thermosetting resin include epoxy resin, phenol resin, polyurethane resin, unsaturated polyester resin, urea resin, and polyimide resin.

The invention according to a seventh aspect of invention of the present application provides the above-described conductive adhesive, wherein in a section that is perpendicular to the thickness direction of the conductive adhesive, conductive particles having a minor axis of 0.01 to 1 µm are contained so that the number of the conductive particles is 30,000 to 300,000/mm$^2$.

The present invention according to an eighth aspect of invention of the present application relates to an electronic apparatus including the electrode-connecting structure according to any one of the first through fifth aspects of invention of the present application. The electrode-connecting structure according to the present invention can be applied to an electrode-connecting structure of members employed in electronic apparatuses such as cameras (e.g., cell-phones, digital cameras, and video cameras), portable audio players, portable DVD players, and notebook-size personal computers.

Advantageous Effects of Invention

By employing the electrode-connecting method according to the present invention, the production cost can be reduced through the simplification of the production process of electrodes and secure electrical connection between the electrodes can be ensured.

DESCRIPTION OF EMBODIMENTS

Figure 1:
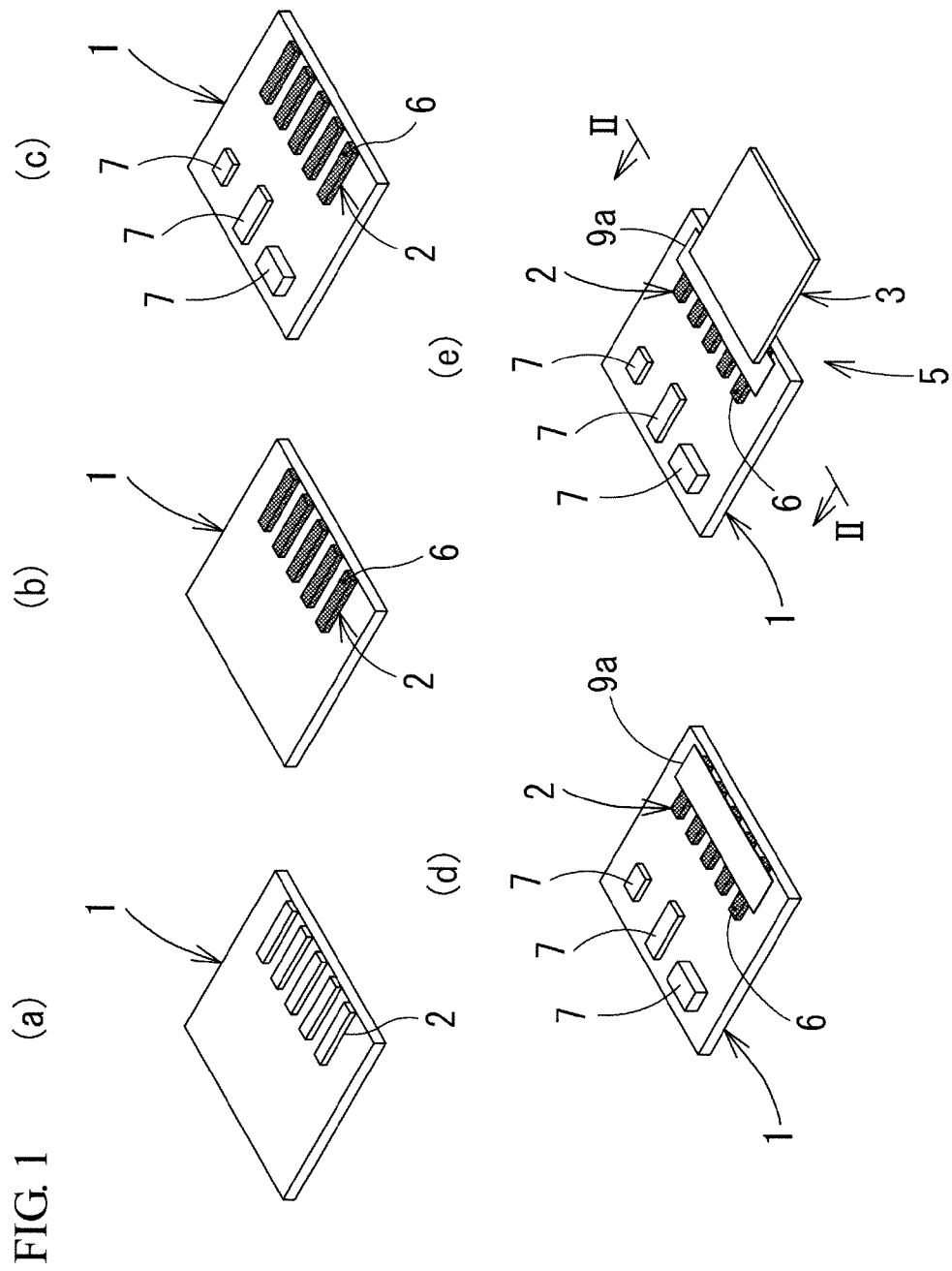
FIG. 1 The (a) to (e) portions of FIG. 1 show an outline procedure of a connecting method according to the present invention.

The (a) to (e) portions of FIG. 1 show an outline procedure of a connecting method according to the present invention. In this embodiment, the electrode-connecting structure according to the present invention is applied to an electrode-connecting structure that connects connection electrodes 2 of a rigid printed circuit board 1 to which electronic components 7 have been connected through solder reflow process to connection electrodes 10 of a flexible printed circuit board 3 for wiring.

As shown in the (a) portion of FIG. 1, each of the wiring connection electrodes 2 is formed at the edge of the rigid printed circuit board 1. As shown in the (b) portion of FIG. 1, an organic film formation step is performed to form an organic film 6 as an oxidation preventing film so that the organic film 6 covers the surface of the wiring connection electrode 2. Herein, electronic components can also be connected by forming the above-described organic film on each of electrodes of the rigid printed circuit board 1 for mounting electronic components without performing the solder reflow process.

The organic film 6 is formed by performing water soluble preflux treatment (organic solderability preservation (OSP) treatment) on the surface of the electrode.

The water soluble preflux treatment is performed through the action of an acid aqueous solution containing an azole compound. Examples of the azole compound include imidazole, 2-undecylimidazole, 2-phenylimidazole, 2,2,4-diphenylimidazole, triazole, aminotriazole, pyrazole, benzothiazole, 2-mercaptobenzothiazole, benzimidazole, 2-butyl benzimidazole, 2-phenylethyl benzimidazole, 2-naphthyl benzimidazole, 5-nitro-2-nonyl benzimidazole, 5-chloro-2-nonyl benzimidazole, 2-amino benzimidazole, benzotriazole, hydroxybenzotriazole, and carboxyl benzotriazole.

Furthermore, an organic film containing at least one organic compound selected from 2-phenyl imidazole groups such as 2-phenyl-4-methyl-5-benzylimidazole, 2,4-diphenylimidazole, and 2,4-diphenyl-5-methyl imidazole and benzimidazole groups such as 5-methyl benzimidazole, 2-alkyl benzimidazole, 2-aryl benzimidazole, and 2-phenyl benzimidazole has a satisfactory oxidation preventing function because of its high thermal resistance and thus is preferably used.

Examples of the method for performing water soluble preflux treatment on the surface of the connection electrode 2 include a spray method, a shower method, and a dipping method. Through washing with water and drying, the organic film 6 is formed. The temperature of the water soluble preflux is preferably 25 to 40° C. and the contact time between the water soluble preflux and the electrode 2 is preferably 30 to 60 seconds.

The thickness of the organic film 6 formed as described above is preferably 0.05 μm or more and 0.5 μm or less. If the thickness of the organic film is less than 0.05 μm, a sufficient oxidation preventing function cannot be ensured. On the other hand, if the thickness of the organic film is more than 0.5 μm, conductive particles in a conductive adhesive cannot be sufficiently brought into contact with the electrode, which increases the connection resistance.

By forming the organic film 6, the oxidation of the connection electrode 2 can be prevented in the above-described electronic component connecting step or the like. In addition, since there is no need to plate an electrode with gold unlike in the conventional method, the production process can be simplified and the production cost can be reduced.

After the water soluble preflux treatment is performed, each of the electronic components 7 is connected to the rigid printed circuit board 1. In this embodiment, the electronic component 7 is connected to a predetermined electrode by applying lead-free solder to the surface of an electronic component connection electrode (not shown) on the rigid printed circuit board 1 using a printing method or the like, placing the electronic component 7 thereon, and inserting the rigid printed circuit board 1 in a reflow furnace.

Herein, the electronic component can also be mounted by plating the electronic component connection electrode with gold. Alternatively, after the same water soluble preflux treatment as that of the above-described connection electrode 2 is performed, the electronic component 7 can be connected by the same method as that of the connection electrode 2 that uses a film-like conductive adhesive, the method being described below.

After the electronic component 7 is connected through solder reflow process, a connection electrode of the flexible printed circuit board 3 for wiring is connected to the connection electrode 2 of the rigid printed circuit board 1.

Figure 2:
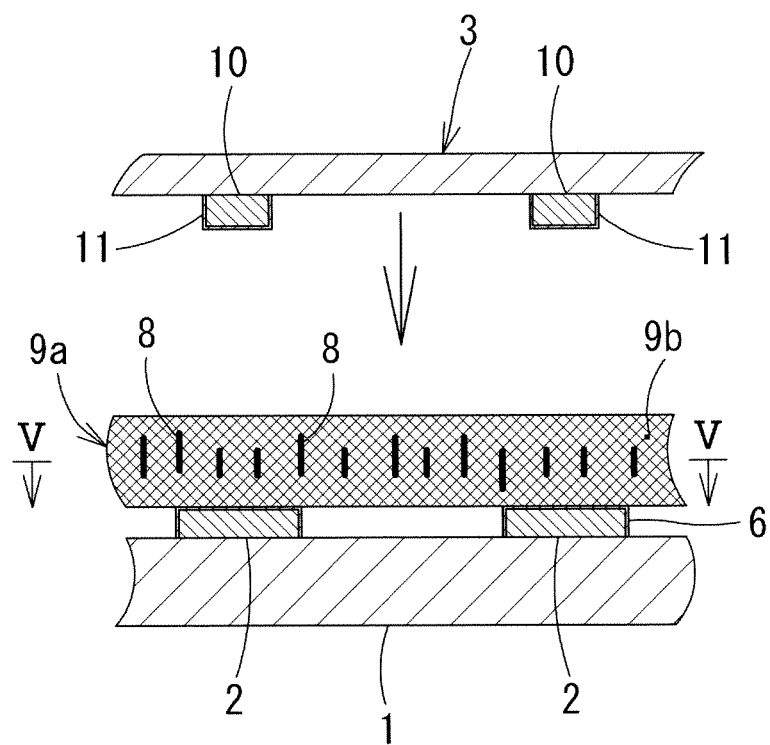
FIG. 2 is an enlarged sectional view of a section corresponding to line II-II in the connecting step shown in the (e) portion of FIG. 1.

As shown in the (d) portion of FIG. 1 and FIG. 2, in this embodiment, a film-like conductive adhesive 9a that is mainly composed of an insulating thermosetting resin such as an epoxy resin and contains a latent curing agent and conductive particles 8 is placed on the surface of the wiring connection electrode 2 of the rigid printed circuit board 1. The conductive adhesive 9a is temporarily bonded to the connection electrode 2 by applying a predetermined pressure in the direction toward the rigid printed circuit board 1 while the conductive adhesive 9a is heated to a predetermined temperature. Alternatively, an adhesive layer can be formed by applying conductive adhesive paste to the surface of the connection electrode 2 on which the organic film 6 has been formed and by orienting the conductive particles 8 through the action of a magnetic field.

Next, as shown in FIG. 2, the connection electrode 2 formed on the surface of the rigid printed circuit board 1 is aligned with a connection electrode 10 of the flexible printed circuit board 3 for wiring while the connection electrode 10 faces downward. The flexible printed circuit board 3 is then placed on the rigid printed circuit board 1 with the conductive adhesive 9a therebetween.

In this embodiment, the same water soluble preflux treatment as that of the connection electrode 2 of the rigid printed circuit board 1 is also performed on the surface of the connection electrode 10 of the flexible printed circuit board 3 to form an organic film 11 for preventing oxidation.

Subsequently, by applying a predetermined pressure between the rigid printed circuit board 1 and the flexible printed circuit board 3 while the conductive adhesive 9a is heated to a predetermined temperature, the connection electrode 2 of the rigid printed circuit board 1 is press-bonded to the connection electrode 10 of the flexible printed circuit board 3 with the conductive adhesive 9a therebetween. The conductive adhesive 9a is mainly composed of a thermosetting resin. Therefore, a base material 9b is softened once by heating, but is cured by continuous heating. After the predetermined curing time is elapsed in the above-described state, the pressure is released and cooling is performed. Thus, the connection electrode 2 of the rigid printed circuit board 1 is connected to the connection electrode 10 of the flexible printed circuit board 3 with an adhesive layer 9 composed of the conductive adhesive 9a therebetween while ensuring electrical continuity.

Figure 3:
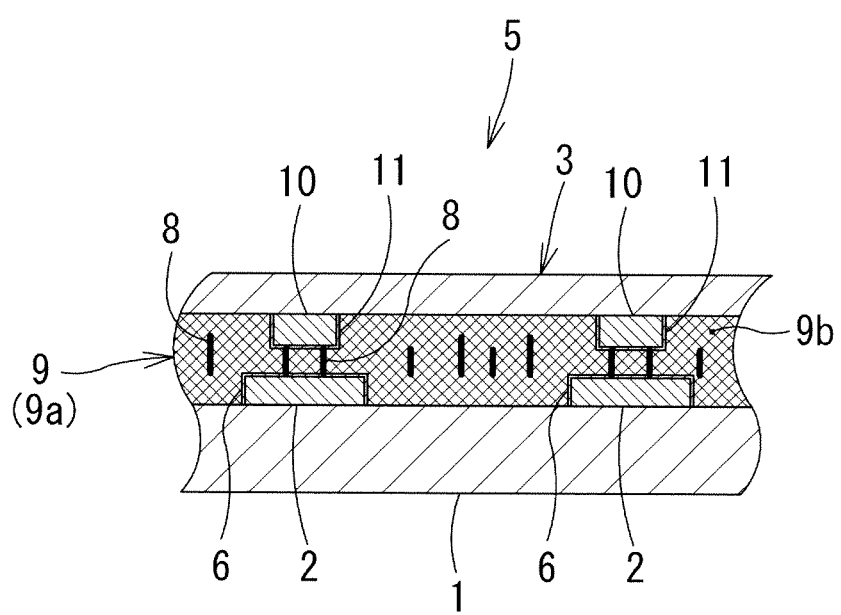
FIG. 3 is an enlarged sectional view of a connecting structure according to the present invention.
Figure 4:
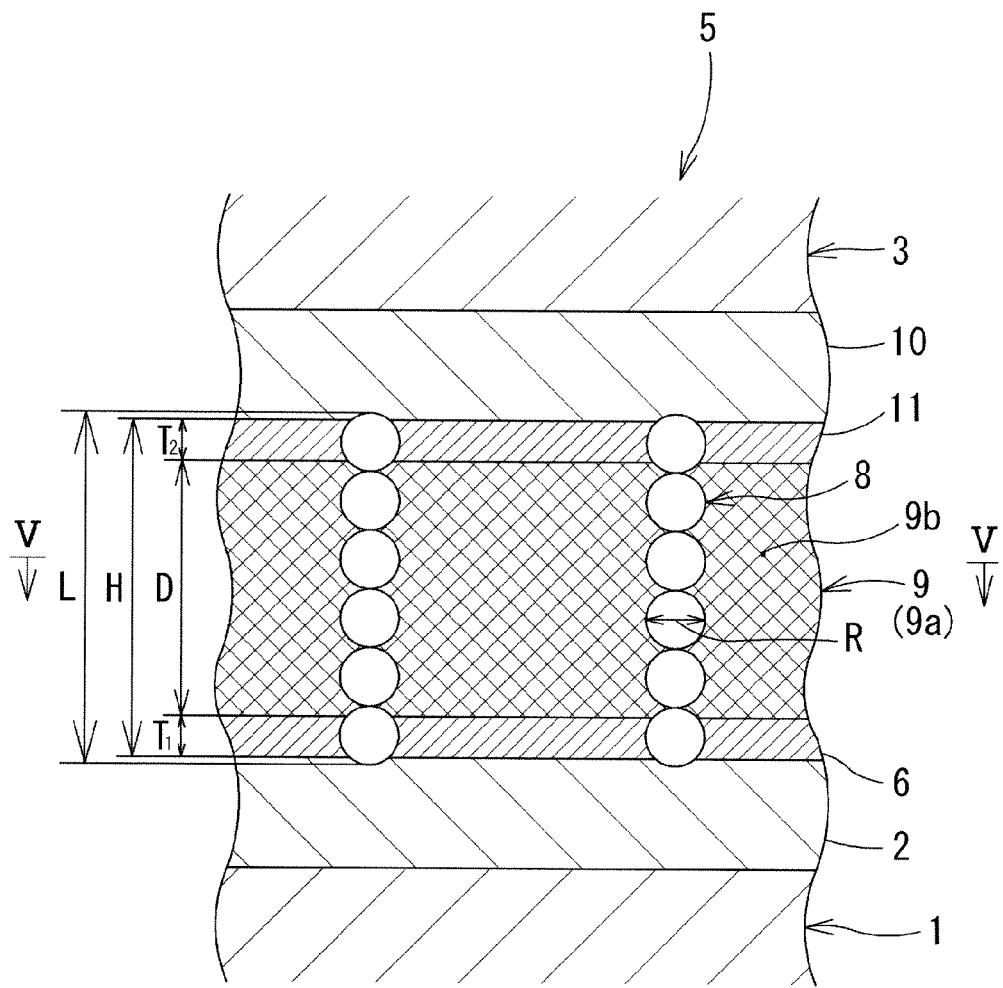
FIG. 4 is an enlarged sectional view schematically showing the connecting structure of FIG. 3.

FIG. 3 is a sectional view of a connecting structure of the rigid printed circuit board 1 and the flexible printed circuit board 3. FIG. 4 is an enlarged sectional view schematically showing the sectional connecting structure of FIG. 3. As is clear from these drawings, in the connecting step, the film-like adhesive 9a is deformed so as to cover the electrodes facing each other by applying a pressure between the circuit boards 1 and 3, whereby the conductive adhesive layer 9 is formed.

As shown in FIG. 4, the conductive adhesive according to this embodiment contains conductive particles 8 whose major axes are oriented in the thickness direction of the adhesive layer 9.

The conductive particles 8 contained in the conductive adhesive 9a according to this embodiment have a form in which many fine metal particles are linearly joined together or a needle-shaped form. By employing such a form of metal particles, in the in-plane direction of the conductive adhesive layer 9, the insulation between the adjacent connection electrodes 2 of the rigid printed circuit board 1 or between the connection electrodes 10 formed on the flexible printed circuit board 3 is maintained to prevent a short circuit between the electrodes. Furthermore, in the thickness direction of the conductive adhesive layer 9, many electrodes 2 and 10 facing each other can be independently electrically connected to each other at the same time.

In this embodiment, as shown in FIG. 4, the size L of the conductive particles 8 in the major-axis direction is set to be larger than the total thickness H of the thickness $T_1$ of the organic film 6 formed on the surface of the connection electrode 2, the thickness $T_2$ of the organic film 11 formed on the surface of the connection electrode 10, and the thickness D of the conductive adhesive layer 9 after the connection.

In the configuration of the conductive particles 8, in the connecting step shown in the (e) portion of FIG. 1, the conductive particles 8 are caused to protrude from both side faces of the conductive adhesive layer 9 by pressing the film-like adhesive in a vertical direction. The edge portions of the conductive particles 8 pierce the organic films 6 and 10 and contact the connection electrodes 2 and 10, respectively.

As shown in FIG. 4, the conductive particles 8 are located so as to act as a bridge between the connection electrodes 2 and 10. As a result, the connection electrodes 2 and 10 are electrically connected to each other. Accordingly, by employing the connecting structure, the connection electrodes 2 and 10 can be connected to each other with certainty and thus an electrode-connecting structure 5 with high reliability can be obtained.

By setting the size L of the conductive particles 8 in the major-axis direction to be larger than the total thickness ($T_1$+$T_2$+D=H) of the thickness $T_1$ of the organic film 6 formed on the surface of the connection electrode 2, the thickness $T_2$ of the organic film 11 formed on the surface of the connection electrode 10, and the thickness D of the conductive adhesive layer, the conductive particles can be caused to protrude from the conductive adhesive layer 9, and thus the electrical resistance between the electrodes can be reduced.

The conductive particles 8 according to this embodiment have an aspect ratio of five or more. By setting the aspect ratio of the conductive particles 8 to be five or more, even if the number of conductive particles is increased, the degradation of the insulating property between the adjacent electrodes due to an increase in volume density is not caused. The contact probability with the electrodes is also increased. Therefore, these electrodes can be connected to each other with certainty. The aspect ratio mentioned herein is the ratio of the average length of major axes (the average value of the length L of the conductive particles 8) to the average length of minor axes (the average value of the length R of the section of the conductive particles 8) of the conductive particles 8 shown in FIG. 4.

Figure 5:
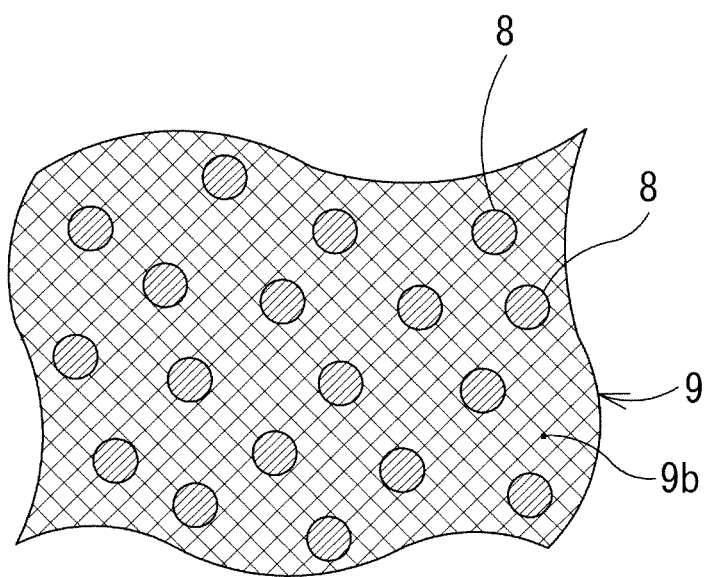
FIG. 5 is a sectional view taken along line V-V of FIG. 4.

In this embodiment, in the section that is shown in FIG. 5 and is perpendicular to the thickness direction of the conductive adhesive layer 9, conductive particles having a minor axis R of 0.2 μm and a major axis L of 3 μm on average are contained so that the number of the conductive particles is 30,000 to 300,000/mm². Note that the aspect ratio of the conductive particles is fifteen.

By specifying the blending amount of the conductive particles having the above configuration as described above, the sufficient number of conductive particles that pierce the organic films 6 and 11 and contact the electrodes can be ensured, and thus an electrode-connecting structure with high reliability can be obtained.

In this embodiment, a film-like conductive adhesive is employed as the conductive adhesive 9a. By employing a film-like adhesive, the major axes of the conductive particles are easily oriented in the thickness direction of the film. Furthermore, the adhesive is easily handled and the heat and pressure treatment can be easily performed. In addition, the edge portions of the conductive particles 8 can be caused to protrude from the conductive adhesive layer 9 by heat and pressure treatment and to easily reach the surfaces of the connection electrodes 2 and 10.

By orienting the major axes of the conductive particles having the above-described aspect ratio in the thickness direction of the film-like conductive adhesive, the insulation between the adjacent connection electrodes 2 of the rigid printed circuit board 1 or between the adjacent connection electrodes 10 of the flexible printed circuit board 3 is maintained to prevent a short circuit between the electrodes. Moreover, many electrodes facing each other can be independently electrically connected to each other at the same time.

In this embodiment, since the organic film 6 is formed and then the electronic component 7 is connected, solder reflow process is performed. Therefore, the organic film 6 formed on the connection electrode 2 of the rigid printed circuit board 1 is hardened by the action of heat in a reflow furnace.

In this embodiment, by setting the length of the major axes of the conductive particles 8 as described above, when the film-like conductive adhesive 9a is pressurized between the connection electrodes 2 and 10, the pressure is exerted in the major-axis direction of the conductive particles and thus the organic films 6 and 11 are easily pierced. Accordingly, the edge portions of the conductive particles 8 easily reach the surfaces of the connection electrodes 2 and 10, and secure electrical connection can be achieved.

Example and Comparative Example of the present invention will now be described. The present invention is not limited to Example.

Example (Preparation of Conductive Adhesive)

Straight-chain nickel fine particles having a major axis L of 3 μm and a minor axis R of 0.2 μm on average were used as conductive particles. Two types of bisphenol-A-type solid epoxy resins [product names: (1) Epikote 1256 and (2) Epikote 1004 manufactured by Japan Epoxy Resins Co.] and a naphthalene-type epoxy resin [product name: (3) EPICLON 4032D manufactured by Dainippon Ink and Chemicals, Incorporated] were used as insulating thermosetting resins. A thermoplastic polyvinyl butyral resin [product name: (4) S-LEC BM-1 manufactured by Sekisui Chemical Co., Ltd.] was used, and (5) a microcapsule-type imidazole-base curing agent [product name: NOVACURE HX3941 manufactured by Asahi Kasei Epoxy Co., Ltd.] was used as a microcapsule-type latent curing agent. These (1) to (5) were blended in the ratio of (1) 35/(2) 20/(3) 25/(4) 10/(5) 30 by weight.

These epoxy resin, thermoplastic resin, latent curing agent, and organic film decomposition component were dissolved and dispersed in cellosolve acetate and then kneaded with a three roll to prepare a solution having a solid content of 50% by weight. The above-described Ni powder was added to the solution so that the metal filling factor that is represented by the ratio of a metal to the total solid content (Ni powder+resins) was 0.01% by volume. The Ni powder was then uniformly dispersed by performing stirring with a centrifugal agitating mixer to prepare a composite material for an adhesive. Subsequently, the composite material was applied to a PET film subjected to release treatment using a doctor knife. The composite material was then dried and solidified at 60° C. for 30 minutes in the magnetic field having a magnetic flux density of 100 mT to prepare a film-like conductive adhesive that has a thickness of 35 μm and anisotropic conductivity and includes straight-chain particles oriented in the magnetic field direction in the coating film. The density of the conductive particles before connection was 37,000/mm².

(Production of Printed Circuit Board)

A flexible printed circuit board was prepared in which 30 connection electrodes were arranged at an interval of 150 μm. The connection electrodes were copper electrodes having a width of 150 μm, a length of 4 mm, and a height of 18 μm. An oxidation preventing film containing 2-phenyl-4-methyl-5-benzylimidazole was formed on the connection electrodes. The decomposition temperature was 310° C. and the average thickness was 0.20 μm.

(Production of Electrode-Connecting Structure)

Solder reflow process was performed on the flexible printed circuit board at a peak temperature of 260° C. in a reflow furnace in which oxygen concentration was adjusted to be 1% or less by the flow of nitrogen. The flexible printed circuit boards were arranged so as to face each other and form a daisy chain that enables the measurement of connection resistance at continuous 30 spots. The prepared conductive adhesive was sandwiched between these flexible printed circuit boards. A pressure of 5 MPa was exerted under heating at 190° C. until the thickness D of the conductive adhesive layer 9 was decreased to 1.5 μm, to obtain a joined body of the flexible printed circuit boards.

(Evaluation of Connecting Structure)

In the joined body, the resistance value at the 30 spots of the laminated body having the conductive adhesive sandwiched between the upper and lower connection electrodes was measured by a four-terminal method and divided by 30 to obtain connection resistance at a single spot. When the connection resistance value was 50 mΩ or less, it was assumed that the conductivity was ensured.

After the joined body produced as described above was left to stand for 500 hours in a high temperature and high humidity oven at 85° C. and 85% RH, connection resistance was measured in the same manner. When the increasing rate of the connection resistance was 50% or less, the connection reliability was determined as good.

Comparative Example

In Comparative Example, an electrode-connecting structure having the same size and obtained from the same material by the same method as in Example was used, except that spherical particles having a diameter of 0.5 μm were employed as the above-described conductive particles.

TABLE

|  | Initial connection resistance (mΩ) | Increasing rate of resistance (%) |
| --- | --- | --- |
| Example | 46 | 5 |
| Comparative Example | 358 | ∞ |

(Evaluation Result)

As is clear from Table, by setting the size of the major axis L to be larger than the total thickness H of the thickness $T_1$ of the organic film 6, the thickness $T_2$ of the organic film 11, and the thickness D of the adhesive layer 9, an electrode-connecting structure with lower electrical resistance can be obtained.

The scope of the present invention is not limited to the above-described embodiment. It should be understood that the embodiment disclosed herein is a mere example in all respects and is not restrictive. The scope of the present invention is defined by the appended claims rather than by the above description. All changes that fall within the scope of the claims and the equivalence thereof are therefore intended to be embraced by the claims.

Industrial Applicability

In an electrode-connecting structure, even if an organic film used as an oxidation preventing film is hardened in solder reflow process that connects electronic components, secure electrical connection can be ensured.

Reference Signs List

| 1 | circuit board (rigid printed circuit board) |
| 2 | first connection electrode |
| 3 | circuit board (flexible printed circuit board) |
| 6 | organic film |
| 5 | electrode-connecting structure |
| 7 | electronic component |

-continued

Reference Signs List

| 8 | conductive particles |
| 9 | conductive adhesive layer |
| 10 | second connection electrode |
| 11 | organic film |

The invention claimed is:

1. An electrode-connecting structure in which a first connection electrode and a second connection electrode are connected to each other with a conductive adhesive layer therebetween, the electrode-connecting structure comprising:
an organic film formed on at least the first connection electrode by a water soluble preflux treatment, the organic film including an azole compound, the organic film comprising a hardened organic film by way of a solder reflow process, and having an average thickness of 0.05 μm or more and 0.5 μm or less; and
conductive particles contained so that major axes of the particles are oriented in a thickness direction of the conductive adhesive layer and the average length of the major axes is larger than the total thickness of at least the conductive adhesive layer and the organic film,
wherein the conductive particles pierce the organic film and contact the first connection electrode and the second connection electrode.

2. The electrode-connecting structure according to claim 1, wherein in a section that is perpendicular to the thickness direction of the conductive adhesive layer, conductive particles having a minor axis of 0.01 to 1 μm are contained so that the number of the conductive particles is 30,000 to 300,000/mm$^2$.

3. The electrode-connecting structure according to claim 2, wherein the conductive particles are metal powder having a needle shape or a shape in which fine metal particles are linearly joined together.

4. The electrode-connecting structure according to claim 3, wherein the conductive particles have an aspect ratio of five or more.

5. The electrode-connecting structure according to claim 2, wherein the conductive particles have an aspect ratio of five or more.

6. The electrode-connecting structure according to claim 1, wherein the conductive particles are metal powder having a needle shape or a shape in which many fine metal particles are linearly joined together.

7. The electrode-connecting structure according to claim 6, wherein the conductive particles have an aspect ratio of five or more.

8. The electrode-connecting structure according to claim 1, wherein the conductive particles have an aspect ratio of five or more.

9. The electrode-connecting structure according to claim 1, wherein the conductive adhesive layer is formed of a film-like conductive adhesive.

10. An electronic apparatus comprising the electrode-connecting structure according to claim 1.

* * * * *